(12) United States Patent
Wang et al.

(10) Patent No.: US 7,750,816 B2
(45) Date of Patent: Jul. 6, 2010

(54) SURGE CURRENT ALARM CIRCUIT

(75) Inventors: Xian-Ming Wang, Shenzhen (CN); Guang-Dong Yuan, Shenzhen (CN); Chung-Chi Huang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 282 days.

(21) Appl. No.: 11/941,977

(22) Filed: Nov. 19, 2007

(65) Prior Publication Data

US 2009/0002183 A1      Jan. 1, 2009

(30) Foreign Application Priority Data

Jun. 28, 2007 (CN) .................. 2007 1 0200908

(51) Int. Cl.
*G08B 21/00* (2006.01)

(52) U.S. Cl. .................. 340/659; 340/635; 340/656; 340/664

(58) Field of Classification Search .................. 340/664
See application file for complete search history.

(56) References Cited

U.S. PATENT DOCUMENTS

| 4,333,049 | A | * | 6/1982 | Yui et al. | .................... | 324/102 |
| 5,959,537 | A | * | 9/1999 | Banting et al. | .............. | 340/664 |
| 5,973,902 | A | * | 10/1999 | King | .......................... | 361/111 |
| 6,259,371 | B1 | * | 7/2001 | Chang | ........................ | 340/659 |
| 6,690,283 | B2 | * | 2/2004 | Nemoto et al. | .............. | 340/664 |
| 2002/0167302 | A1 | * | 11/2002 | Gallavan | ................ | 324/117 R |
| 2004/0085696 | A1 | * | 5/2004 | Mendoza et al. | ........... | 361/93.1 |
| 2004/0181698 | A1 | * | 9/2004 | Williams | .................... | 713/300 |
| 2006/0232906 | A1 | * | 10/2006 | Sueoka | ........................ | 361/118 |

* cited by examiner

*Primary Examiner*—Benjamin C Lee
*Assistant Examiner*—Curtis J King
(74) *Attorney, Agent, or Firm*—Frank R. Niranjan

(57) ABSTRACT

An exemplary surge current alarm circuit includes a detecting circuit to detect a surge current and convert the surge current into a digital signal with a pulse width corresponding to a duration of an over value part of the surge current when the surge current is over a limitative current value; a processing circuit connected to the detecting circuit to receive the digital signal and generate an alarm signal when the pulse width of the digital signal is over a limitative time; and an alarm circuit connected to the processing circuit to give an alarm upon receiving the alarm signal from the processing circuit.

9 Claims, 1 Drawing Sheet

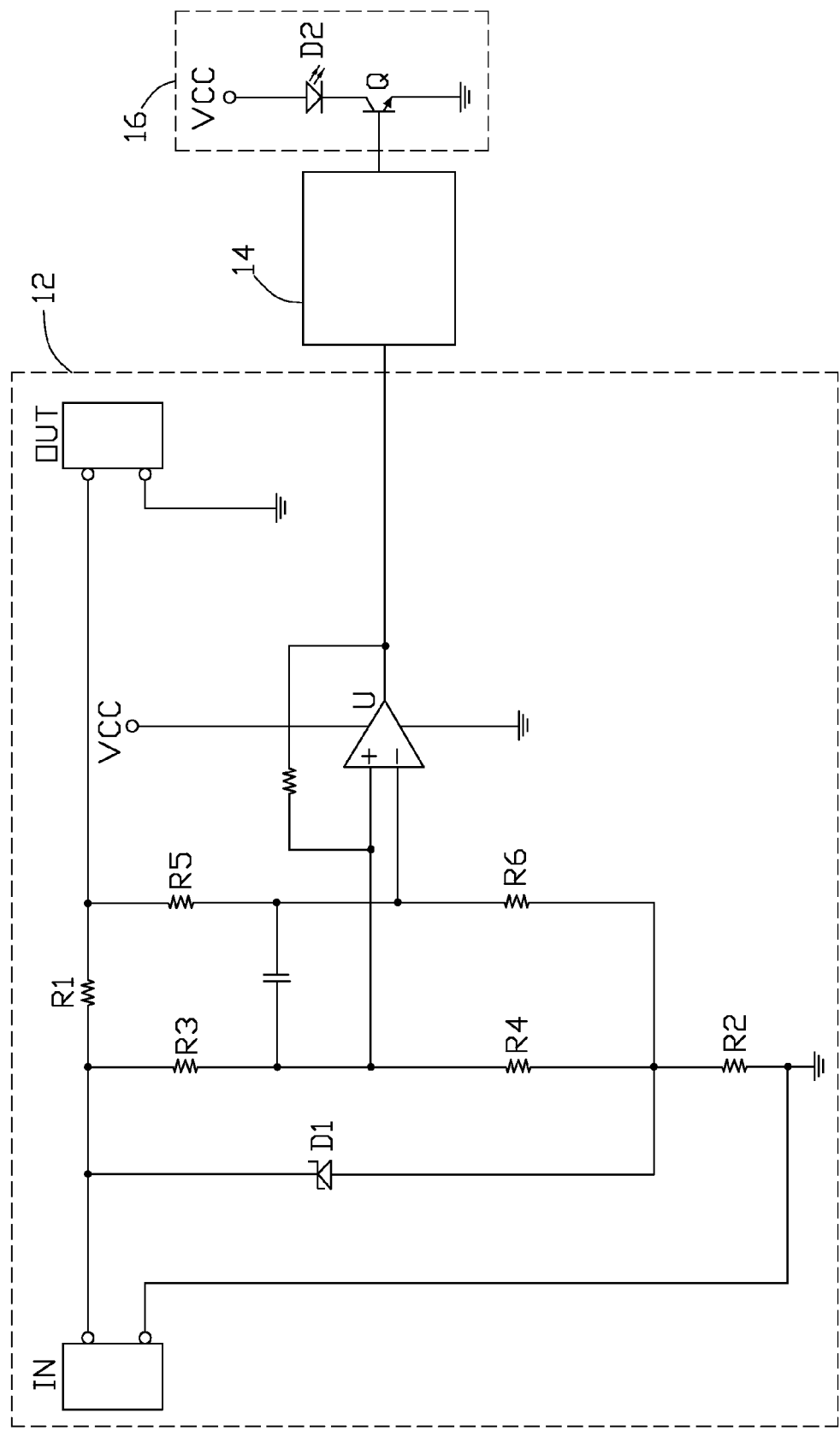

SURGE CURRENT ALARM CIRCUIT

BACKGROUND

1. Field of the Invention

The present invention relates to an alarm circuit, and particularly to a surge current alarm circuit.

2. Description of Related Art

When the voltage of a DC power supply is supplied to an electronic equipment, the rapid rise in the voltage when the power is switched ON produces surge current (rush current), which is a large current that flows to the electronic equipment.

If the surge current is higher than a limitative rated current value of the electronic equipment and lasts longer than a limitative rated time of the electronic equipment, the electronic equipment will be damaged.

SUMMARY

An exemplary surge current alarm circuit includes a detecting circuit to detect a surge current and convert the surge current into a digital signal with a pulse width corresponding to a duration of an over value part of the surge current when the surge current is over a limitative current value; a processing circuit connected to the detecting circuit to receive the digital signal and generate an alarm signal when the pulse width of the digital signal is over a limitative time; and an alarm circuit connected to the processing circuit to give an alarm upon receiving the alarm signal from the processing circuit.

Other advantages and novel features of the present invention will become more apparent from the following detailed description of preferred embodiment when taken in conjunction with the accompanying drawing, in which:

BRIEF DESCRIPTION OF THE DRAWINGS

The drawing is a circuit diagram of a surge current alarm circuit in accordance with the present invention.

DETAILED DESCRIPTION

Referring to the drawing, a surge current alarm circuit in accordance with a preferred embodiment of the present invention includes a detecting circuit 12, a processing circuit 14, and an alarm circuit 16.

The detecting circuit 12 includes an input port IN having an anode, and a grounded cathode, an output port OUT having an anode, and a grounded cathode, six resistors R1~R6, a Zener diode D1, and a comparator U. The input port IN is coupled to a power source and the output port OUT is coupled to an electronic equipment. The resistor R1 is connected between the anodes of the input port IN and the output port OUT. The Zener diode D1 includes a cathode connected to the anode of the input port IN and an anode, which is grounded via the resistor R2. The comparator U includes a non-inverting terminal + connected to the anode of the input port IN via the resistor R3 and grounded via the resistors R4 and R2 in turn, an inverting terminal − connected to the anode of the input port IN via the resistors R5 and R1 in turn and grounded via the resistors R6 and R2 in turn, and an output terminal connected to the processing circuit 14.

The processing circuit 14 includes a complex programmable logic device (CPLD) having an input terminal connected to the output terminal of the comparator U and an output terminal connected to the alarm circuit 16.

The alarm circuit 16 includes an NPN transistor Q functioning as an electrical switch and a light emitting diode (LED) D2 functioning as an annunciator. The base of the transistor Q is connected to the output terminal of the processing circuit 14, the collector is connected to the cathode of the LED D2, and the emitter is grounded. The anode of the LED D2 is connected to a DC power source VCC.

In this embodiment, an output voltage of the power source is 12 volts. A regulated voltage of the Zener diode D1 is 4 volts. The resistance of the resistors R1 and R3~R5 are 0.025 Ohm, 1 KOhm, 1 KOhm, 1 KOhm, and 1.05 KOhm.

When the power source is switched ON, surge current generated from the power source flows to the electronic equipment via the resistor R1 of the detecting circuit 12. Therefore, an output voltage of the output port Vout is found using the following equation: Vout=12−I*R1, wherein I is a value of the surge current. An input voltage V+ of the non-inverting terminal + of the comparator U is found using the following equation: V+=(12−Vref)*R4/(R3+R4)+Vref=8 volts, wherein Vref is a voltage of the resistor R2 which is 4 volts. An input voltage V− of the inverting terminal − of the comparator U is found using the following equation: V−=(Vout−Vref)*R6/(R5+R6)+Vref. An output voltage Va of the comparator U is found using the following equation: Va=(V+)−(V−)=0.025*I*0.512−0.096. When the output voltage Va of the comparator U is 0 volt, the value of the surge current I is 7.5 amperes. Therefore, 7.5 amperes is a limitation value of the surge current, if the surge current is higher than 7.5 amperes the comparator U will output a digital signal which is at a high level voltage with a pulse width corresponding to a duration of an over range part of the surge current.

The CPLD receives the high level voltage generated by the comparator U and outputs a high level voltage when the pulse width of the digital signal is over a predetermined time. The function of the CPLD is written to the CPLD as software program. Here is an example of the program code:

```
module inrush(rstn,ctl,drv,clk,csense);
input rstn,ctl,clk,csense;
output drv;
reg drv;
reg [7:0] q;
reg [6:0] en;
reg [2:0] stu;
initial stu [2:0] = 3'b0;
wire enable;
wire [7:0] q_o;
assign q_o[1] = (en[0]) ? q[1] : 1'b1;
assign q_o[2] = (en[1]) ? q[2] : 1'b1;
assign q_o[3] = (en[2]) ? q[3] : 1'b1;
assign q_o[4] = (en[3]) ? q[4] : 1'b1;
assign q_o[5] = (en[4]) ? q[5] : 1'b1;
assign q_o[6] = (en[5]) ? q[6] : 1'b1;
assign q_o[7] = (en[6]) ? q[7] : 1'b1;
assign q_o[0] = q[0];
assign enable = q_o[0]&& q_o[1]&& q_o[2]&&
q_o[3]&& q_o[4]&& q_o[5]&& q_o[6]&&
q_o[7];
always @ (posedge enable or negedge rstn)
   begin
      if(!rstn)
         drv <= 1'b0;
      else
      begin
         if(enable)
            drv <= 1'b1;
         else
            drv <= 1'b0;
      end
   end
always @ (posedge clk or negedge rstn)
```

-continued

```
begin
    if(!rstn)
        q[7:0] <= 8'b0;
    else
        begin
            q[0] <= csense;
            q[7:1] = q[6:0];
        end
    end
end
always @ (posedge ctl or negedge rstn)
begin
    if(!rstn)
        begin
            stu <= 3'b0;
            en <= 7'b0;
        end
    else
        begin
            case (stu)
                3'b0:
                    begin
                        stu <= 3'b1;
                        en <= 7'b0000001;
                    end
                3'b1:
                    begin
                        stu <= 3'b10;
                        en <= 7'b0000011;
                    end
                3'b10:
                    begin
                        stu <= 3'b11;
                        en <= 7'b0000111;
                    end
                3'b11:
                    begin
                        stu <= 3'b100;
                        en <= 7'0001111;
                    end
                3'b100:
                    begin
                        stu <= 3'b101;
                        en <= 7'b0011111;
                    end
                3'b101:
                    begin
                        stu <= 3'b110;
                        en <= 7'b0111111;
                    end
                3'b110:
                    begin
                        stu <= 3'b111;
                        en <= 7'b1111111;
                    end
                3'b111:
                    begin
                        stu <= 3'b0;
                        en <= 7'b0000000;
                    end
            endcase
        end
end
endmodule
```

Therefore, if the surge current is higher than 7.5 amperes and last longer than 3.3 nS limited by the software program, the CPLD will output a high level voltage to turn on the NPN transistor Q for driving the alarm circuit 16.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A surge current alarm circuit comprising:
    a detecting circuit to detect a surge current and convert the surge current into a digital signal with a pulse width corresponding to a duration of an over value part of the surge current when the surge current is over a limitative current value;
    a processing circuit connected to the detecting circuit to receive the digital signal and generate an alarm signal when the pulse width of the digital signal is over a limitative time; and
    an alarm circuit connected to the processing circuit to give an alarm upon receiving the alarm signal from the processing circuit, wherein
    the detecting circuit comprises:
        an input port with an anode and a grounded cathode;
        an output port with an anode and a grounded cathode;
        a detecting resistor connected between the anodes of the input port and the output port;
        a Zener diode having a cathode connected to the anode of the input port and an anode grounded via a first resistor; and
        a comparator having a non-inverting terminal connected to the anode of the input port via a second resistor and grounded via a third resistor and the first resistor in turn, an inverting terminal connected to the anode of the input port via a fourth resistor and the detecting resistor in turn and grounded via a fifth resistor and the first resistor in turn, and an output terminal connected to the processing circuit.

2. The surge current alarm circuit as claimed in claim 1, wherein the processing circuit includes a complex programmable logic device (CPLD).

3. The surge current alarm circuit as claimed in claim 2, wherein the alarm circuit includes an electrical switch having a first terminal coupled with the processing circuit, a second terminal, and a third terminal which is grounded, and an annunciator coupled between a power source and the second terminal of the electrical switch.

4. The surge current alarm circuit as claimed in claim 3, wherein the electrical switch is an NPN transistor and the annunciator is a light emitting diode with an anode connected to the power source and a cathode connected to the collector of the transistor, the base of the transistor is connected to the processing circuit and the emitter of the transistor is grounded.

5. A surge current alarm circuit comprising:
    a detecting circuit having an input port coupled with a power source and an output port coupled with a load, and a converter to detect a surge current flowing from the power source to the load and convert the surge current into a digital signal with a pulse width corresponding to a duration of an overvalue part of the surge current when the surge current is over a limitative current value;
    a processing circuit having a complex programmable logic device (CPLD) connected to the detecting circuit to receive the digital signal and generate an alarm signal when the pulse width of the digital signal is over a predetermined time; and
    an alarm circuit connected to the processing circuit to give an alarm upon receiving the alarm signal from the processing circuit, wherein
    the detecting circuit comprises:
    said input port with an anode and a grounded cathode;
    said output port with an anode and a grounded cathode;

a detecting resistor connected between the anodes of the input port and the output port;

a Zener diode having a cathode connected to the anode of the input port and an anode grounded via a first resistor; and a comparator having a non-inverting terminal connected to the anode of the input port via a second resistor and grounded via a third resistor and the first resistor in turn, an inverting terminal connected to the anode of the input port via a fourth resistor and the detecting resistor in turn and grounded via a fifth resistor and the first resistor in turn, and an output terminal connected to the CPLD.

6. The surge current alarm circuit as claimed in claim 5, wherein the converter is a comparator having a non-inverting terminal to receive an input voltage according to the surge current, an inverting terminal to receive a reference voltage according to the limitative current value, and an output terminal connected to the processing circuit to generate a high level voltage when the input voltage is higher than the reference voltage.

7. The surge current alarm circuit as claimed in claim 6, wherein the converter generates a high level voltage to drive the alarm circuit when duration of the high level voltage generated by the converter is longer than the predetermined time.

8. The surge current alarm circuit as claimed in claim 7, wherein the alarm circuit includes an electrical switch controlled by the converter and an annunciator coupled in series between a power source and ground.

9. The surge current alarm circuit as claimed in claim 8, wherein the electrical switch is an NPN transistor.

* * * * *